(12) United States Patent
Cai et al.

(10) Patent No.: US 9,780,276 B2
(45) Date of Patent: Oct. 3, 2017

(54) WAFER-LEVEL SEMICONDUCTOR DEVICE AND MANUFACTURING METHOD THEREOF

(71) Applicant: SUZHOU INSTITUTE OF NANO-TECH AND NANO-BIONICS (SINANO), CHINESE ACADEMY OF SCIENCE, Jiangsu (CN)

(72) Inventors: Yong Cai, Jiangsu (CN); Yibin Zhang, Jiangsu (CN); Fei Xu, Jiangsu (CN)

(73) Assignee: Suzhou Institute of Nano-Tech and Nano-Bionics, Chinese Academy of Sciences, Suzhou (CN)

( * ) Notice: Subject to any disclaimer, the term of this patent is extended or adjusted under 35 U.S.C. 154(b) by 0 days.

(21) Appl. No.: 15/111,675

(22) PCT Filed: Jan. 16, 2015

(86) PCT No.: PCT/CN2015/070836
§ 371 (c)(1),
(2) Date: Jul. 14, 2016

(87) PCT Pub. No.: WO2015/109968
PCT Pub. Date: Jul. 30, 2015

(65) Prior Publication Data
US 2016/0336500 A1    Nov. 17, 2016

(30) Foreign Application Priority Data

Jan. 23, 2014 (CN) .......................... 2014 1 0032377
Apr. 28, 2014 (CN) .......................... 2014 1 0173907
Apr. 28, 2014 (CN) .......................... 2014 1 0175210

(51) Int. Cl.
*H01L 33/64* (2010.01)
*H01L 33/42* (2010.01)
(Continued)

(52) U.S. Cl.
CPC .......... *H01L 33/642* (2013.01); *H01L 27/156* (2013.01); *H01L 33/0095* (2013.01);
(Continued)

(58) Field of Classification Search
CPC ....... H01L 33/642; H01L 33/62; H01L 33/42; H01L 33/18; H01L 33/0095; H01L 33/44;
(Continued)

(56) References Cited

U.S. PATENT DOCUMENTS

| | | | |
|---|---|---|---|
| 2008/0179602 A1* | 7/2008 | Negley ............... | H01L 21/2654 257/88 |
| 2011/0122341 A1* | 5/2011 | Hayashi .................. | G09G 3/32 349/65 |
| 2012/0223875 A1* | 9/2012 | Lau ....................... | H01L 27/156 345/83 |

* cited by examiner

*Primary Examiner* — Evan Pert
*Assistant Examiner* — Changhyun Yi
(74) *Attorney, Agent, or Firm* — Wang Law Firm, Inc.

(57) ABSTRACT

The present invention discloses a wafer-level semiconductor device and a manufacturing method thereof. The wafer-level semiconductor device comprises a wafer-level substrate; a plurality of serial groups formed on a surface of the substrate and are disposed in parallel, each serial group comprising a plurality of parallel groups disposed in series, each parallel groups comprising a plurality of unit cells disposed in parallel, wherein each unit cell is an independent functional unit which is formed by processing a semiconductor layer directly grown on a surface of the substrate; and a lead, which is at least electrically connected between two selected parallel groups in each serial group to make ON-voltages of all the serial groups substantially consistent. The device of the present invention, with a simple structure, a simple and convenient manufacturing process, and a high efficiency to produce qualified products, can be put into large-scale production and application.

29 Claims, 13 Drawing Sheets

(51) Int. Cl.
*H01L 33/18* (2010.01)
*H01L 33/62* (2010.01)
*H01L 33/44* (2010.01)
*H01L 27/15* (2006.01)
*H01L 33/00* (2010.01)

(52) U.S. Cl.
CPC ............... *H01L 33/18* (2013.01); *H01L 33/42* (2013.01); *H01L 33/44* (2013.01); *H01L 33/62* (2013.01); *H01L 2224/94* (2013.01)

(58) Field of Classification Search
CPC .. H01L 27/156; H01L 25/075–25/0756; H01L 25/13; H01L 25/16–25/167
See application file for complete search history.

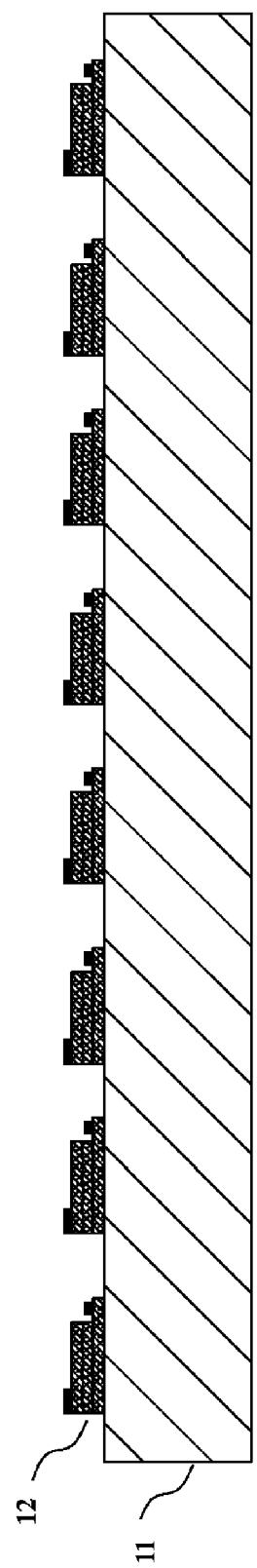

WAFER-LEVEL SEMICONDUCTOR DEVICE AND MANUFACTURING METHOD THEREOF

TECHNICAL FIELD OF THE INVENTION

The present invention relates to a semiconductor device and a preparation process thereof and in particular to a high-power and large-area wafer-level semiconductor device and a preparation process thereof. This wafer-level semiconductor device is a device which is formed on a wafer and in which a plurality of unit cells are connected in parallel, and it can be put into use without cutting.

BACKGROUND OF THE INVENTION

In recent years, people have put forward higher and higher requirements on the power of LED lighting fixtures. To obtain a high-power light source, the common method in the art is to integrally assemble a plurality of small-size LED chips manufactured by a traditional process in one device. As one of the typical solutions, referring to CN103137643A and CN103107250A, by fixedly assembling a plurality of small-size LED chips on a substrate by bonding or the like, and by electrically connecting the plurality of LED chips by using a certain circuit form, a high-power LED device is formed. With such processes, a high-power LED device can be obtained. However, crucial operations like chip packaging, system integration and installation procedure or the like are all complicated. As a result, the total cost for manufacturing a device is dramatically increased, thereby limiting the promotion and application of high-power LED devices.

The most direct and easiest way to manufacture a high-power LED is to increase the area of LED device chips. However, in practice, almost nobody will manufacture high-power LED devices in this way due to a low yield of products. As for a semiconductor device, the yield of chips is closely related to the area of the chips, which can be expressed by Formula (1):

$$P_1 = P_2^{\frac{A1}{A2}} \quad (1)$$

where $P_1$ and $P_2$ are yields of LED chips with an area of $A_1$ and $A_2$, respectively. Assuming that the yield of LED chips with an area of 1 mm² is 99%, it can be concluded by calculation that the yield of devices experiences a dramatic decrease as the area of chips is increased. As shown in FIG. 1, when the area of chips is increased to 500 mm², the yield thereof has been decreased to below 1%. However, when the area of chips is increased to 1000 mm², the yield is only 0.34/10000. Chips with such an area cannot be used for producing large-area and high-power LED devices.

As a result, in order to produce large-area and high-power semiconductor device chips and even high-power devices of wafer-level chips to reduce cost for packaging and application, the distribution of and interconnection between LED chips is required to be exquisitely researched and designed.

SUMMARY OF THE INVENTION

In view of defects of the prior art, one of the objectives of the present invention is to provide a wafer-level semiconductor device with advantages of simple and convenient manufacturing process, low cost, high yield and the like.

Another objective of the present invention is to provide a process for preparing the wafer-level semiconductor device.

To achieve the objectives, the present invention adopts the following technical solutions.

A wafer-level semiconductor device is provided, including:
a wafer-level substrate,
a plurality of serial groups which are formed on a surface of the substrate and are disposed in parallel, each serial group including a plurality of parallel groups disposed in series, each parallel group including a plurality of unit cells disposed in parallel, each unit cell being an independent functional unit which is formed by processing a semiconductor layer directly grown on the surface of the substrate; and
a lead, which is at least electrically connected between one selected parallel group in each serial group and one electrode of the semiconductor device and/or between two selected parallel groups to make ON-voltages of all the serial groups substantially consistent.

A method for preparing a wafer-level semiconductor device is provided, including:
forming a plurality of serial groups disposed in parallel on a surface of a wafer-level substrate, wherein each serial group comprises a plurality of parallel groups disposed in series, and each parallel group includes a plurality of unit cells disposed in parallel, and each unit cell is an independent functional unit which is formed by processing a semiconductor layer directly grown on the surface of the substrate; and
electrically connecting a selected parallel group in each serial group to one electrode of the semiconductor device and/or electrically connecting two selected parallel groups in each serial group through a lead to make ON-voltages of all the serial groups substantially consistent.

As one of typical implementations, this manufacturing method can include the following steps:
(1) providing a wafer-level substrate having a semiconductor layer gown on a first surface;
(2) forming a plurality of unit cells by processing the semiconductor layer;
(3) selecting part of the plurality of unit cells as normal unit cells and the remaining as redundant unit cells, dividing all the normal unit cells into more than two multi-stage unit groups which are disposed in parallel, any one of the multi-stage unit groups comprising more than two first parallel groups; and
selecting and connecting M first parallel groups in any one of the multi-stage unit groups with N second parallel groups in series to form a serial group, to make ON-voltages of the more than two serial groups substantially consistent,
wherein any one of the first parallel groups includes a plurality of normal unit cells disposed in parallel, and any one of the second parallel groups includes a plurality of redundant unit cells disposed in parallel, M being a positive integer, N being 0 or a positive integer.

The unit cells are device units with an independent and integrated function, and conducting semiconductor layers of any two unit cells are separated to make any one unit cell electrically independent; and by a metal interconnect, a plurality of unit cells are electrically connected to form a bigger device so that a more enhanced device performance is achieved, for example, increased power or the like.

A diameter of the wafer-level substrate is over 2 inches.

As a typical example, the unit cell can be a semiconductor laser, a light-emitting element (for example, an LED), and an electronic element (for example, a diode).

Further, at least in one serial group, the two selected parallel groups are not arranged adjacent to each other.

As one of the typical implementations, all the unit cells formed on the surface of the substrate include a plurality of normal unit cells and a plurality of redundant unit cells, the plurality of normal unit cells are arranged as a plurality of multi-stage unit groups disposed in parallel, any one of the multi-stage unit groups includes a plurality of parallel groups disposed in series, and M first parallel groups selected from any one of the multi-stage unit groups form a serial group with N second parallel groups.

wherein any one of the first parallel groups includes a plurality of normal unit cells disposed in parallel, and any one of the second parallel groups includes a plurality of redundant unit cells disposed in parallel, M being a positive integer, N being 0 or a positive integer.

Preferably, at least one serial group has at least one matched resistor.

As one of the typical implementations, more than two first parallel groups selected from at least one multilayer unit group are connected in series with at least one second parallel group directly through a lead to form a serial group.

Preferably, an ON-voltage of the serial group is 110 V±20 V, 220 V±40 V, or 380 V±70 V.

Further, the wafer-level semiconductor device can also include a cooling structure hermetically connected to the substrate, and a selected region of a second surface of this substrate is exposed to a cooling medium circulation cavity in this cooling structure, and the selected region corresponds at least to a region of a first surface of the substrate in which the plurality of unit cells are distributed.

Further, the wafer-level semiconductor device can also include a cooling structure hermetically connected to the substrate, and the plurality of unit cells are exposed to a cooling medium circulation cavity in this cooling structure.

For example, a typical heat dissipation structure (or called "cooling structure") applied to a wafer-level semiconductor device can include at least one heat dissipation housing connected to the wafer-level semiconductor device, a cavity which can store a heat-conducting medium is provided inside the heat dissipation housing; and at least a local region, at least corresponding to the functional unit cell, of one surface of the wafer-level semiconductor device is exposed to the cavity.

Further, a heat dissipation mechanism is at least distributed in at least a local region of one surface, which is exposed to the cavity, of the wafer-level semiconductor device.

The heat dissipation mechanism includes plural platy and/or columnar heat dissipation components at least connected to one surface of the wafer-level semiconductor device.

The heat dissipation structure includes plural fin-shaped heat dissipation plates arranged on one surface of the wafer-level semiconductor device in parallel or multiple heat dissipation columns distributed on one surface of the wafer-level semiconductor device in arrays.

A reflecting layer is connected on one surface of the wafer-level semiconductor device exposed to the cavity, and the functional unit cell is distributed on the other surface of the wafer-level semiconductor device.

A reflecting layer can also be disposed between the heat dissipation mechanism and one surface of the wafer-level semiconductor device.

A heat-conducting medium inlet and a heat-conducting medium outlet communicated with the cavity can also be distributed on the heat dissipation housing.

The heat dissipation housing has an enclosed inner cavity and the heat dissipation housing also has plural heat dissipation fins.

The heat dissipation housing and the wafer-level semiconductor device can be fixed by welding.

In addition, in a preferred implementation of the present invention, a plug-in electrical connection structure can also be used in the wafer-level semiconductor device, the plug-in electrical connection structure including an insulating matrix and an elastic conducting mechanism, the elastic conducting mechanism being fixedly connected to the insulating matrix, wherein an elastic holding structure for holding the wafer-level semiconductor device is formed between a selected portion at one end or between two ends of the elastic conducting mechanism and the insulating matrix; when the wafer-level semiconductor device is inserted into the elastic holding structure, the selected portion at one end or between two ends of the elastic conducting mechanism also electrically contacts a cathode or an anode of the wafer-level semiconductor device.

The elastic conducting mechanism can be a metal reed, one end of which is fixedly connected to the insulating matrix and the other end thereof is a moving end.

Preferably, the other end of the metal reed has at least one arc structure, and when the wafer-level semiconductor device is inserted into the elastic holding structure, a top end of the at least one arc structure electrically contacts a cathode or an anode of the wafer-level semiconductor device.

Further, the elastic conducting mechanism is fixedly connected to one end of the insulating substrate, and the other end thereof has a projection; and the elastic holding structure is formed between the projection and the selected portion at one end or between two ends of the elastic conducting mechanism.

Further, the elastic conducting mechanism is electrically connected to a power supply through a lead distributed on the insulating matrix.

Further, when the wafer-level semiconductor device is inserted into the elastic holding structure, the insulating matrix contacts the other surface of the substrate.

When compared with the prior art, the present invention has at least the advantages of simple structure, simple and convenient manufacturing process, and high yield, so that it can be put into large-scale production and application.

BRIEF DESCRIPTION OF THE DRAWINGS

FIG. 4a to FIG. 4b are respectively a top view and a cross-sectional view of a wafer-level LED device in one preferred embodiment of the present invention;

REFERENCE NUMBERS

10: transfer baseboard;
11: wafer-level substrate;
12: functional unit cell;
121: n-type semiconductor;
122: p-type semiconductor;
123: light-emitting quantum well;
124: insulating medium;
13: interconnect metal;
14: cathode;
15: anode;
16: reflecting layer;
171: fin-shaped heat dissipation plate;
172: heat dissipation column;
20: LED chip;
201: substrate;
202: epitaxial layer;
203: working electrode;
21: cavity;
22: heat dissipation housing;
23: phase change heat dissipation housing;
24: heat dissipation fin;
30: bonding layer;
31: insulating matrix;
32: metal lead;
33: metal reed;
34: solder layer;
400: lead;
421: photonic crystal structure;
422: big lens;
423: small lens assembly;
51: briquette;
52: bolt;
53: seal ring 53;
61: phase change liquid;
62: phase change steam;
a: first parallel group;
a': first parallel group;
b: serial group;
b': serial group;
1: sapphire substrate;
2: GaN epitaxial layer;
3: ITO layer;
4: silicon dioxide mask;
5: insulating medium layer; and
6: interconnect metal.

DETAILED DESCRIPTION OF THE INVENTION

Taking an LED device as an example, in principle, there are two main failure modes for LED devices, i.e. short-circuit failure and open-circuit failure. To obtain a large-area and high-power LED chip, LEDs can be connected in series in multiple stages or can be connected in parallel.

With regard to connection in series, if short-circuit failure occurs in one or more stages, other LEDs without failure can still work. Thus, such a connection way can resist short-circuit failure. However, if broken-circuit failure occurs in any one stage, all the LEDs will not work. Thus, such a connection way cannot resist broken-circuit failure.

Assuming that in LEDs connected in series in n stages, the probability of occurrence of short-circuit in a certain stage is $P_s$, the probability $P_{sk}$ of occurrence of short-circuit in k stages can be expressed as follows:

$$P_{sk}=C_n^k P_s^k(1-P_s)^{n-k}$$

Figure 1:
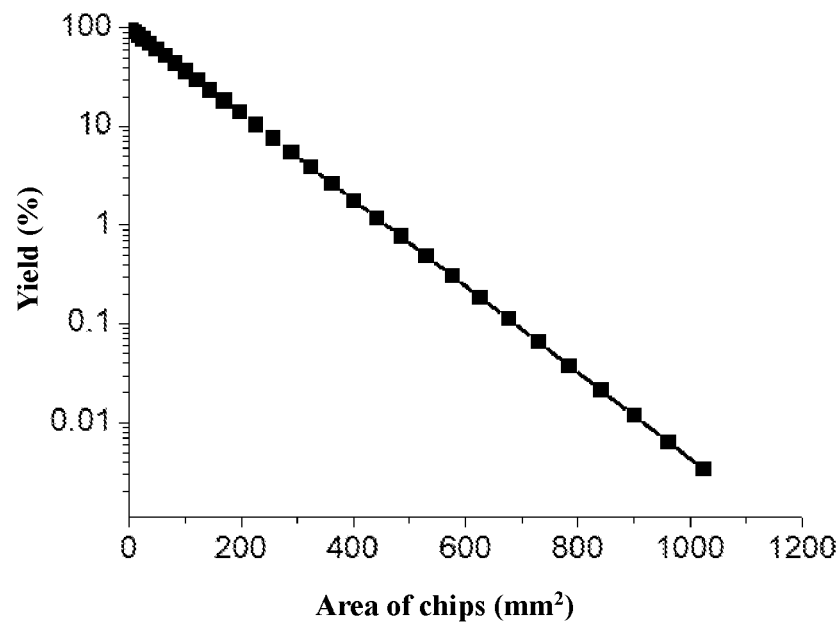
FIG. 1 is a graph showing the relation between the yield of LED chips and the area of chips.
Figure 2:
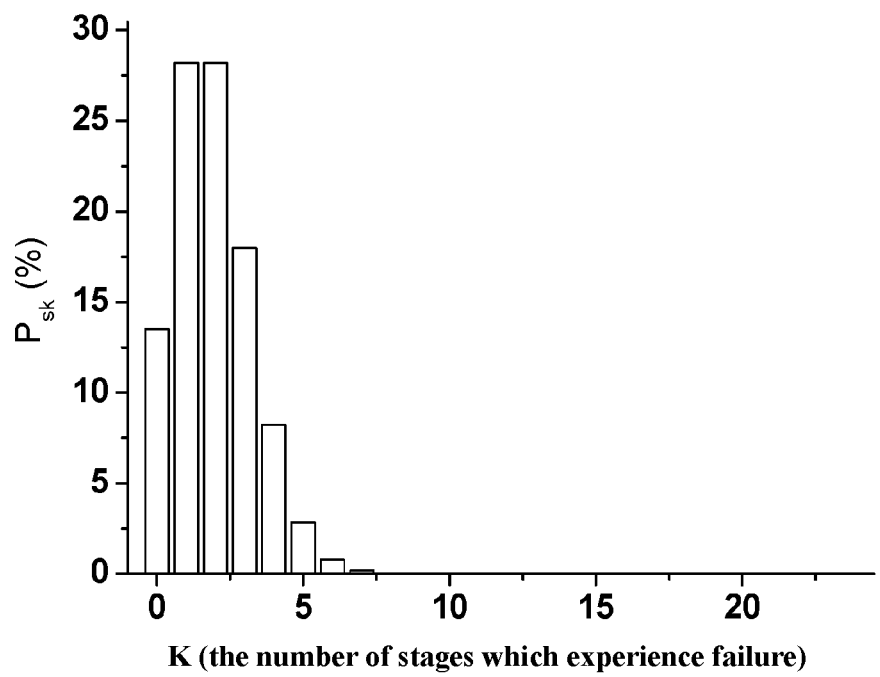
FIG. 2 is a probability distribution diagram of short-circuit failure stages of serial LEDs.

Taking an LED chip in which LED unit cells with an area of 1 mm² in each stage are serially connected in 24 stages as an example, if the probability of occurrence of short-circuit in a certain stage is $P_s$ ($P_s$=2%), the probability distribution of failure in k stages can be calculated, as shown in FIG. 2.

In FIG. 2, it can be seen that stages k which experience short-circuit concentrate below stage 5. By summation, it can be concluded that the overall probability of occurrence of short-circuit in stages below 5 is over 98%. From the perspective of products, even if short-circuit occurs in 5 stages, the serially-connected LEDs can still work normally although the maximum power is decreased by about 20% and the efficiency is slightly reduced when compared with LEDs having short-circuit in 0 stage. Thus, after lowering the quality level of devices having short-circuit in 5 stages, the devices can still be put into the market (at present, for LED products, similar strategies of selling products by grade are adopted). This means that the overall yield of products can reach 98%.

Similarly, the probability of broken-circuit failure can be analyzed. Still taking LEDs connected in series in 24 stages as an example, if the probability of broken-circuit failure in a certain stage is $P_o$ ($P_o$=2%), the device can work only when there is no broken-circuit in all stages. The yield is only: $P_{oo}=C_{24}^0 P_o^0(1-P_o)^{24}=13.5\%$.

By probability analysis, the yield of a plurality of LEDs that are connected in parallel can also be analyzed. Taking an LED in which 24 unit cells are connected in parallel as an example, if the short-circuit failure probability ($P_s$) and broken-circuit failure probability ($P_o$) of the unit cells are 2%, it can be concluded by analysis that: (1) only when 0 unit cell experiences short-circuit, the LED can work normally, and the yield is 13.5%; and (2) when k unit cells experience broken-circuit, the LED can still work normally;

and when k is less than or equal to 5, the overall yield is over 95%. Thus, such a parallel connection way can resist broken-circuit failure.

The short-circuit failure and the broken-circuit failure as described above are main failure modes in LEDs. Thus, when designing a large-area LED chip, especially a wafer-level LED chip, consideration must be paid to resist those two failures.

Correspondingly, the inventor of the present invention provides a relatively effective designing method, which can be summarized as:

1) electrically independent LED unit cells are formed in a chip;
2) first, those unit cells are connected in parallel in groups to prevent broken-circuit failure;
3) those parallel groups are connected in series to form a number of serial groups in order to prevent short-circuit failure; the number of serial stages is limited by a practical power supply, because if there are too many serial stages, for example, 500 stages with 3.5 V of each stage, the voltage driving the power supply should reach 1750 V, and such a voltage is difficult to reach and at a great expense even feasible in practice; thus, it is a relatively reasonable solution to connect those parallel groups in series so that the rated voltage of each serial group is approximate to 110 V, 220 V or 380 V of the power supply;
4) then, a number of serial groups are connected in parallel to form a large-area and high-power LED chip.

Further, LED is a current-type semiconductor device, and the current thereof is exponential to the voltage, which can be expressed as:

$$I = I_s \cdot \exp\left(\frac{eV}{n_{ideal}kT}\right),$$

where $I_S$ is a reverse saturation current, and $n_{ideal}$ is an ideal factor of the device. With regard to LEDs that are serially connected in n stages, the voltage of each stage is approximate to the n-stage average of the overall voltage.

According to analysis of FIG. 2, it can be found that short-circuit may occur in several stages of the LEDs that are serially connected. In view of this, as for a number of serial groups that are formed by connecting parallel groups in series, even each group has a same number of serial stages, the number of stages experiencing short-circuit after the LEDs are manufactured practically may be different, leading to a mismatched voltage. For example, if there is an LED chip formed of two 24-stage serial groups, a threshold of each stage is 3.5 V, the number of short-circuit failure stages of one of the two serial groups is 0, and the number of short-circuit failure stages of the other one is 1, the overall threshold voltages of the two serial groups are 84 V and 80.5 V, respectively. If the two serial groups are connected to a same power supply, the current $I_2$ of the serial group of 80.5 V is far greater than the current $I_1$ of the serial group of 84V. If the influence from the parasitic resistance of the chip is ignored, it can be concluded by calculation that:

$$\frac{I_2}{I_1} = \exp\left(\frac{\frac{80.5}{23} - \frac{80.5}{24}}{n_{ideal}\frac{kT}{e}}\right) = 16.5 \text{ folds.}$$

where $n_{ideal}$ is 2 and kT/e is 0.026 V, meaning that the first serial group does not work when the second serial group works normally. Thus, modifications must be made to the design principle 4), including the following methods.

A number of redundancy stages are designed in the serial groups. The difference between the redundancy stages in the serial group and the parallel stages in the serial group is that, the redundancy stages, due to a relatively large electrode, can be contacted by a probe for electrical tests. When a chip is manufactured, the serial groups and the redundancy stages thereof are electrically tested. Then, according to the principle of a consistent threshold voltage, the redundancy stages are connected to an output electrode by a jumper. In order to match the threshold voltages of the serial groups and the redundancy stages thereof more accurately, by connecting resistors, further matching is performed according to a set working current.

The "jumper" described here should be regarded as a lead which is used for directly and electrically connecting circuits, especially two specific demand points in a serial circuit; and furthermore, there is more than one functional element, which is used for forming this serial circuit, between the two demand points, for example, more than one parallel group as described above.

Still further, as one aspect of the present invention, the wafer-level semiconductor device provided by the present invention is formed by processing a wafer-level substrate with a semiconductor material layer (which can also be called "epitaxial layer") grown on its surface, the main structure thereof including: a wafer-level substrate, and a plurality of unit cells which are formed by processing a semiconductor layer directly grown on a first surface of the substrate and which has a set function.

As another aspect of the present invention, the present invention provides a process for preparing the wafer-level semiconductor device, including the following steps: after an epitaxial grows and is formed on a wafer-level substrate, and by processing, a plurality of unit cells distributed in arrays are formed on the substrate.

Obviously, it can be seen that when compared with a traditional packaging process of a semiconductor chip or an integrated semiconductor device, the manufacturing process of the wafer-level semiconductor device of the present invention is at least free from operations like thinning, cutting and splitting of the substrate and also free from packaging of small-size semiconductor chips one by one, and even free from the necessity of conducting the subsequent operations only after bonding the small-area semiconductor chips to the transfer substrate one by one. With one time of packaging, the major structure of a high-power semiconductor device can be built. Such manufacturing method is easy to operate and low in cost, and can omit many operation steps which may cause damage to epitaxial wafers and unit cells, and substantially, will not cause environmental pollution.

Of course, in order to eventually make the wafer-level semiconductor device work normally, working electrodes are required to be arranged in each unit cell so that it can be connected to the power supply. However, such an operation of arranging a working electrode can be implemented by technical methods well known to those skilled in the art, for example, but not limited to, metal evaporation process, micro-machining process or the like.

Particularly to semiconductor light-emitting devices, if the selected substrate is a transparent wafer, for example, a sapphire wafer, when the wafer-level semiconductor device of the present invention is applied as a flip-chip device, the substrate which is not thinned can also be used as a light-emitting window, so that the light-emitting efficiency of the device is further improved.

Further, to make the wafer-level semiconductor device work more stably, the inventor of the present invention also has carried out researches and practices about the electrical connection mode of unit cells, and proposed the following circuit layout concept, including:

part of unit cells formed on the substrate are defined as normal unit cells and the remaining as redundant unit cells, wherein the normal unit cells serve as effective working units when the wafer-level semiconductor device is working, while a large part of the redundant unit cells serve as standby working unit. Thus, the number of normal unit cells should be as many as possible and much greater than the number of redundant unit cells.

Then, the plurality of normal unit cells are divided into more than two multi-stage unit groups disposed in parallel, and any one of the multi-stage unit groups includes more than two first parallel groups disposed in series; and M first parallel groups selected from any one of the multi-stage unit groups are also connected in series with N second parallel groups to form a serial group in order to eventually make ON-voltages of the serial groups substantially consistent (generally within ±10%), wherein any one of the first parallel groups includes more than two normal unit cells disposed in parallel, and any one of the second parallel groups includes more than two redundant unit cells disposed in parallel, M being a positive integer, N being 0 or a positive integer.

By this circuit design, a situation in which other normal unit cells cannot work because one or more unit cells break down can be avoided, and a defect, in which the circuit cannot work normally because there is a difference between the ON-voltage of a certain serial working circuit and the ON-voltage of other serial working circuits due to the difference between the performance of one or more normal units and the performance of the remaining normal units in a certain multi-stage unit group, can be eliminated too.

Preferably, M first parallel groups can be selected from any one of the multi-stage unit groups and connected with N second parallel groups in series directly through a lead to form a serial group, and the remaining one or more abnormal first parallel groups are isolated from the working circuit to make ON-voltages of the serial groups substantially consistent, thereby ensuring the working stability of the devices and improving the working efficiency thereof. Of course, in some situations, in a certain serial group, no second parallel group may be included, and instead, part of the first parallel groups are selected to be directly and electrically connected with working electrodes of the semiconductor device through a lead.

As another preferred implementation, at least one matched resistor also can be provided in each serial group mentioned before. This matched resistor can be a resistor with a fixed resistance and the resistance thereof can be determined according to the difference in ON-voltage of each serial group and the remaining serial groups. Of course, an adjustable resistor can also be preferred.

Further, with respect to the fact that there are problems such as large heat generation and limited heat dissipation ability when a high-power semiconductor device is working, especially for a wafer-level semiconductor device which has high power, heat dissipation becomes an unavoidable problem. In a traditional heat dissipation method for a semiconductor device, a chip is pasted on a tubular heat sink and then pasted on a surface of a heat dissipation device; and the heat dissipation device dissipates heat generated by the device by natural convection of air, blowing by a fan, or heat exchange with a cooling liquid. Since the total power of a wafer-level device can be as high as hundreds and even thousands watts, such heat dissipation measures could no longer meet the requirements. Thus, a new heat dissipation method must be explored.

One of the effective heat dissipation methods is to bring a liquid or gaseous cooling medium to directly contact one surface of a wafer-level device to avoid the thermal resistance generated by a heat sink, the thermal resistance generated by welding and the thermal resistance generated by a heat dissipation device. Thus, the shortest heat dissipation path is obtained and the best heat dissipation performance is achieved.

For example, as one of the preferred implementations, an active cooling structure hermetically connected to a substrate can be used, and a selected region of a second surface of the substrate is exposed to a cooling medium circulation cavity of the cooling structure. Furthermore, the selected region at least corresponds to a region of a first surface of the substrate on which the plurality of unit cells are distributed. However, the circulation speed of the cooling medium can be adjusted according to practical situation. In this way, the heat generated by unit cells during working can be transferred in a timely and quickly manner so that the device is free from damage caused by a mass of heat accumulation.

For another example, as for a device of a flip-chip structure, as one of the preferred implementations, a cooling structure can also be hermetically connected on a substrate and the plurality of unit cells are exposed to a cooling medium circulation cavity of the cooling structure.

In addition, in the present invention, as for the expression "wafer-level", it means that a diameter of a substrate is over 2 inches.

Furthermore, the wafer-level semiconductor device described in the present invention includes a semiconductor light-emitting device, for example, but not limited to, an LED.

Figure 3:
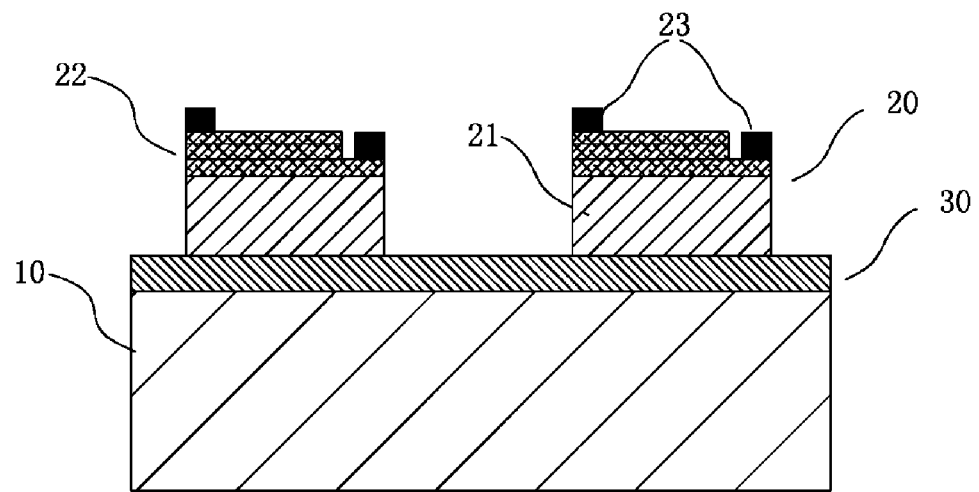
FIG. 3 is a schematic structure diagram of an existing integrated high-power LED device.

As one more specific implementation of the present invention, with reference to FIG. 3, the method for preparing the wafer-level semiconductor device also can include:

(1) directly processing the semiconductor material layer to form a plurality of unit cells 2 with a set function, and setting part of all the unit cells 2 in a normal region as normal unit cells and the remaining as redundant unit cells.

(2) dividing all the normal unit cells into more than two multi-stage unit groups disposed in parallel, any one of the multi-stage unit groups including more than two first parallel groups disposed in series, and any one of the first parallel groups including more than two normal unit cells disposed in parallel;

(3) testing the ON-voltage of each multi-stage unit group, and according to the test result, selecting M first parallel groups from each multi-stage unit group and connecting them with N second parallel groups in series to form a serial group, to make ON-voltages of the serial groups in the working state substantially consistent.

wherein each of the second parallel groups includes more than two redundant unit cells disposed in parallel, M being a positive integer, N being 0 or a positive integer.

In conclusion, the wafer-level semiconductor device of the present invention has the advantages of simple and convenient manufacturing process, low cost, high yield, so that it can be put into large-scale production and application.

The technical solutions of the present invention will be further described in detail as below with reference to the accompanying drawings by a number of preferred embodiments.

Figure 4A:
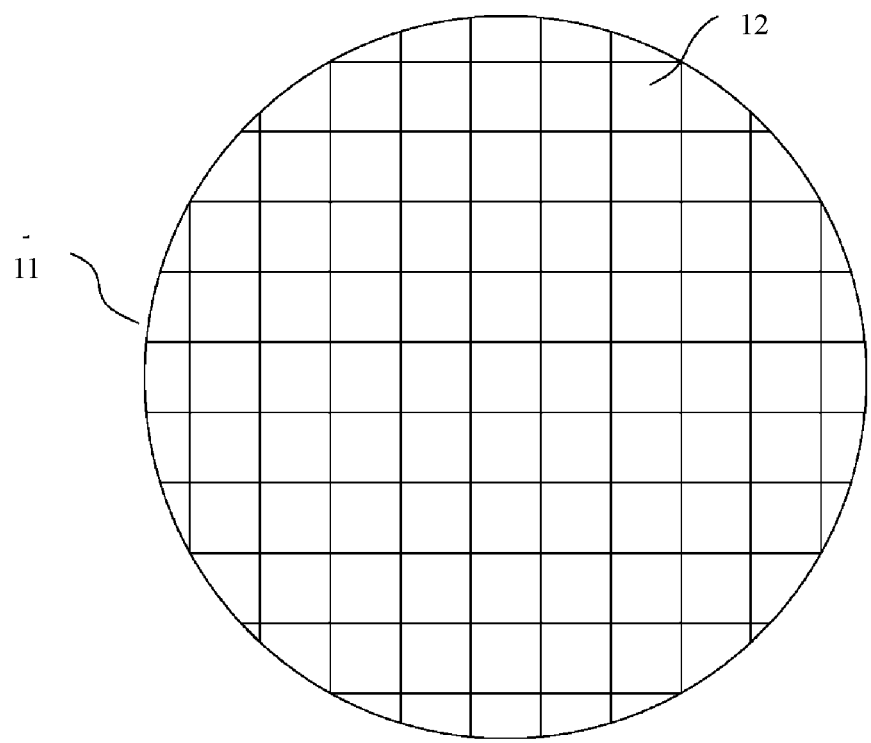

With reference to FIG. 4a to FIG. 4b, this embodiment relates to a wafer-level LED device, including a wafer-level substrate 11 and a plurality of unit cells 12 fixedly arranged on a top end face ("first surface") of a substrate 1, the plurality of unit cells being formed by dividing a semiconductor layer directly grown on the first surface of the substrate.

The substrate can be, but not limited to, a sapphire wafer, an SiC wafer, an Si wafer or the like.

The semiconductor layer can also be called epitaxial layer which can include a PN heterojunction, an active layer, or various composition units which are well known in the art and used for forming a light-emitting semiconductor device. Thus, the structure thereof will not be repeated here.

The LED unit cell is a functional unit which can emit light when driven by a certain working voltage. Furthermore, with what has been described before, LED unit cells should be electrically isolated from each other.

Further, the unit cells include a plurality of normal unit cells and a plurality of redundant unit cells,
wherein the plurality of normal unit cells are divided into a number of multi-stage unit groups disposed in parallel, any one of the multi-stage unit groups including a number of first parallel groups a disposed in series. Furthermore, M first parallel groups selected from any one of the multi-stage unit groups are connected with N second parallel groups in series directly through a lead to form a serial group b, and the ON-voltages of all serial groups are substantially consistent.

The "substantially consistent" here means that of the variation in ON-voltage of the serial groups is within ±10%.

The any one of the first parallel groups includes more than two normal unit cells disposed in parallel, and any one of the second parallel groups includes more than two redundant unit cells disposed in parallel, M being a positive integer, N being 0 or a positive integer.

Figure 5A:
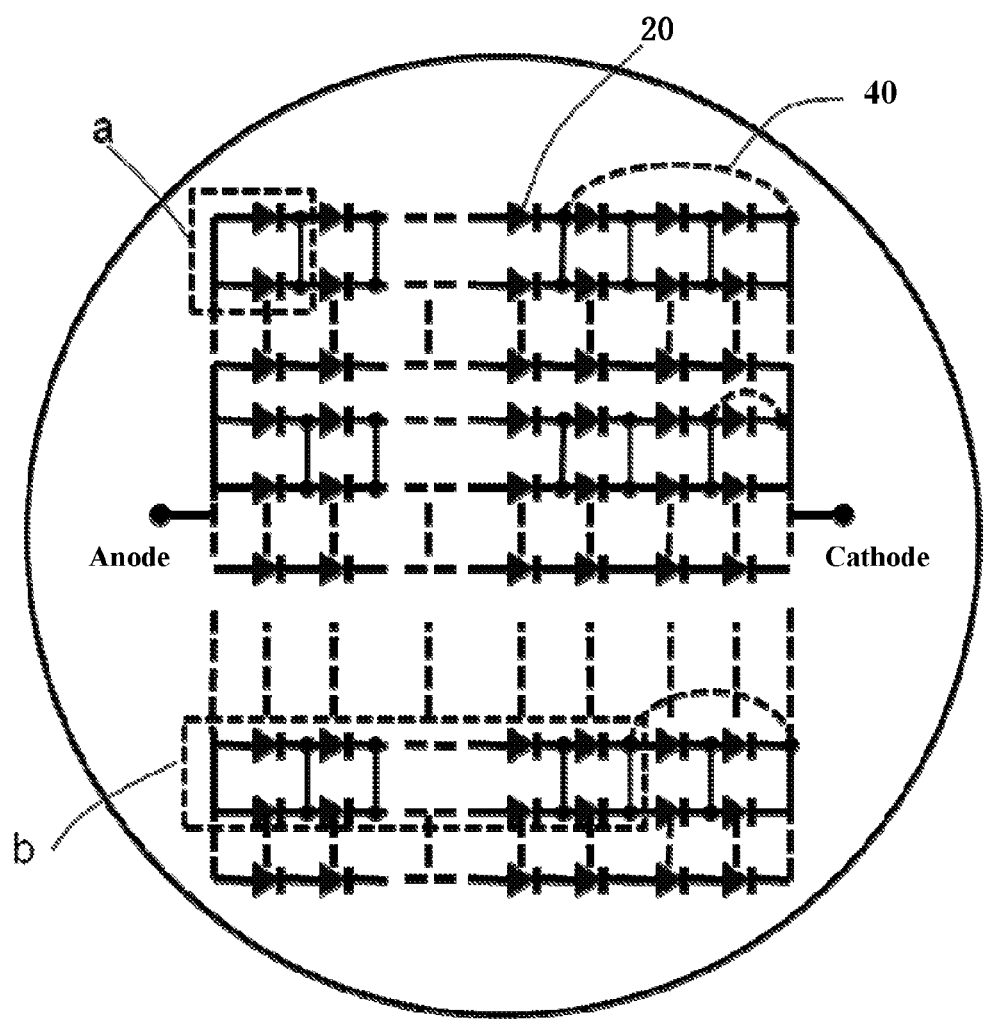
FIG. 5a is a working circuit diagram of a wafer-level LED device in one preferred embodiment of the present invention.
Figure 5B:
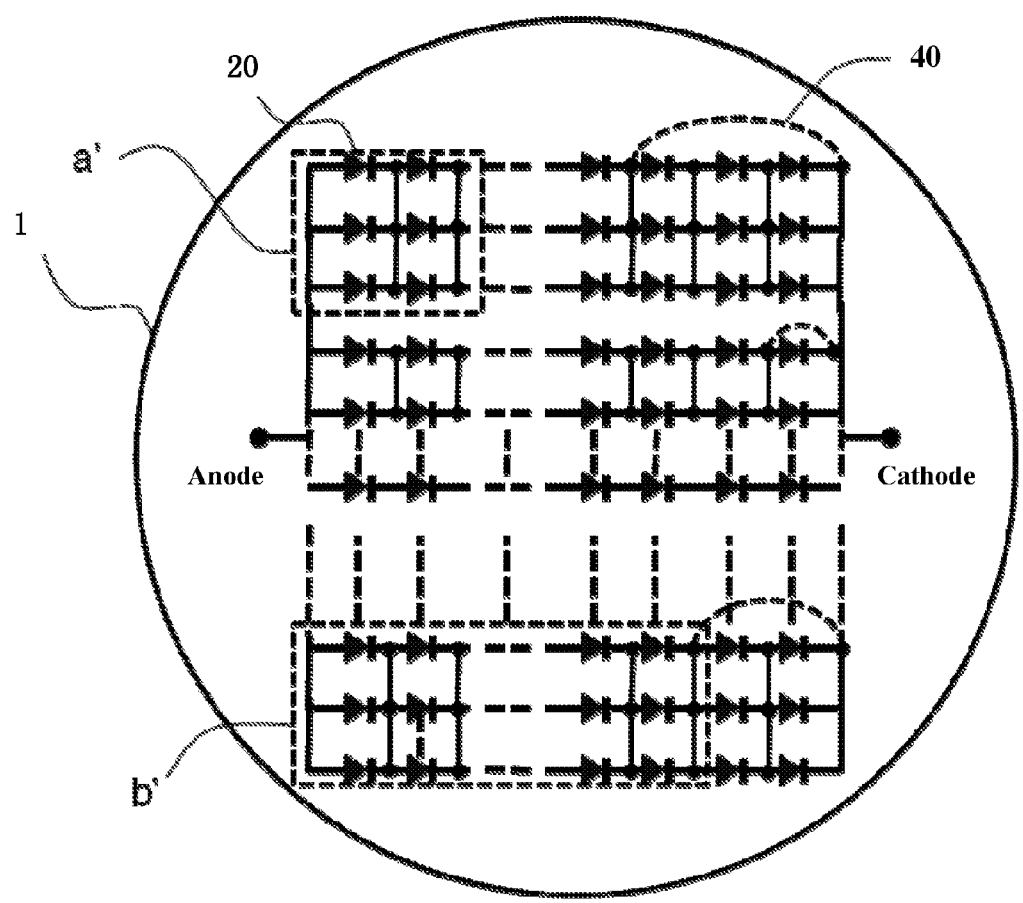
FIG. 5b is a working circuit diagram of another wafer-level LED device in one preferred embodiment of the present invention.

With reference to embodiments shown in FIG. 5a to FIG. 5b, wherein N is 0. In each multi-stage unit group, a specific site is selected to be directly and electrically connected to one working electrode of the device, that is, part or all of the first parallel groups in each multi-stage unit group are connected in series to form a serial group, to eventually make ON-voltages of all serial groups substantially consistent.

Figure 6:
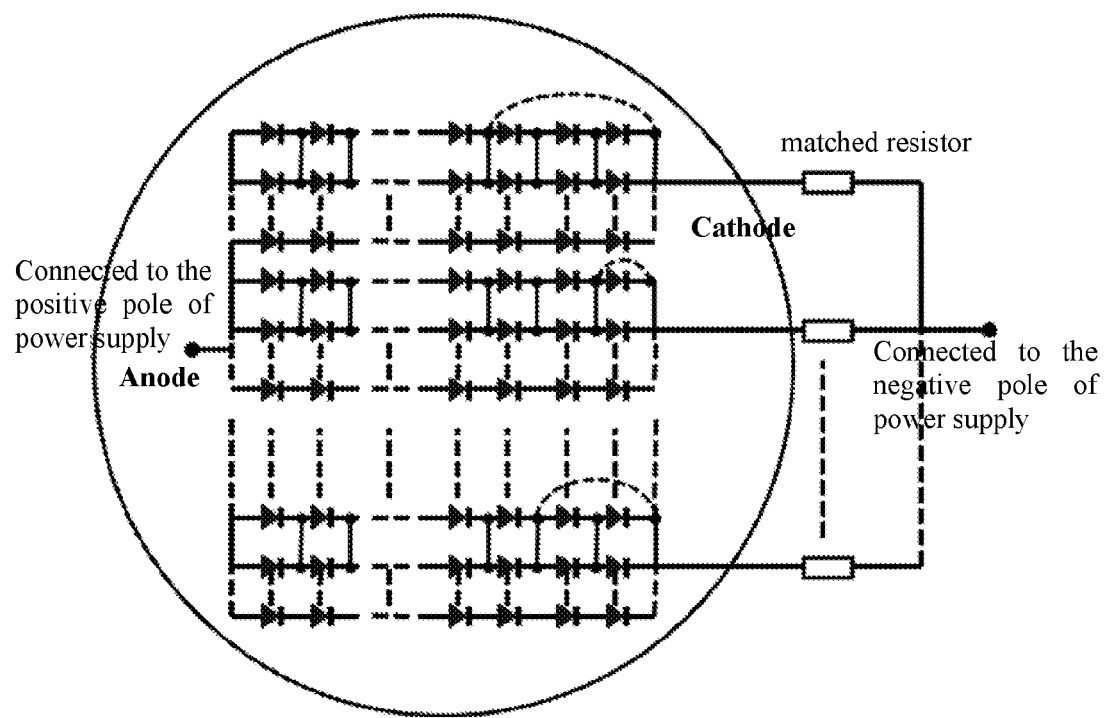
FIG. 6 is a working circuit diagram of a wafer-level LED device in another preferred embodiment of the present invention.

Further, with reference to FIG. 6, in another preferred embodiment of the present invention, at least one matched resistor can be connected to each serial group in the circuit structure as described in the above embodiment. The matched resistor can be specifically adjusted according to the difference in ON-voltage of the serial groups as described in the above embodiment, and the difference in ON-voltage of the serial groups is eventually eliminated, so that the wafer-level LED device obtained will have the best working stability and light-emitting efficiency.

In addition, as for the wafer-level LED device, the preparation thereof can include:
(1) processing the semiconductor material layer to form a plurality of unit cells with a set function, and setting part of all the unit cells in a normal region as normal unit cells and the remaining as redundant unit cells;
(2) dividing all the normal unit cells into more than two multi-stage unit groups disposed in parallel, any one of the multi-stage unit groups including more than two first parallel groups disposed in series, and any one of the first parallel groups including more than two normal unit cells disposed in parallel;
(3) testing the ON-voltage of each multi-stage unit group, and according to the test result, selecting M first parallel groups from each multi-stage unit group and connecting them with N second parallel groups in series to form a serial group, to make ON-voltages of the serial groups in the working state substantially consistent,
wherein each of the second parallel groups includes more than two redundant normal unit cells disposed in parallel, M being a positive integer, N being 0 or a positive integer.

Further, at least one matched resistor can also be provided in each serial group.

In the above embodiment, to achieve an electrical connection between unit cells, a working electrode and an electrical connection circuit between unit cells can be processed on each unit cell by various processes well known to those skilled in the art, for example, but not limited to, metal evaporation, deposition, micro-machining or the like.

In addition, in order to make the obtained wafer-level LED device have a better light-emitting efficiency, an emitted light wavelength conversion structure, a reflecting layer, an anti-reflection structure, an optical lens or the like can be introduced to the device for packaging. In the present invention, since the wafer-level LED device can be regarded as a large LED chip in fact, instead of separately packaging each unit cell, the whole device may be packaged for once. In this way, the packaging process is greatly simplified and the packaging material can also be saved in fact.

Of course, in order to eventually make the wafer-level semiconductor device work normally, a working electrode is also required to be arranged in each unit cell so that it can be connected to the power supply. However, such an operation of arranging a working electrode can be implemented by technical methods well known to those skilled in the art, for example, but not limited to, metal evaporation process, micro-machining process or the like.

In addition, due to the need for dissipating heat of a high-power LED device, a cooling structure can be added to the wafer-level LED device obtained in the above embodiment, for example, a heat sink, a micro-fluid cooling structure or the like that are commonly used at present.

However, considering a relatively low heat dissipation efficiency of the commonly used cooling structures, in the present invention, the following two cooling structures may be used, including:
first, as for a device installed in a normal form, a cooling structure can be hermetically connected to a substrate, and a selected region of a second surface of the substrate is completely exposed to a cooling medium circulation cavity in the cooling structure, and the selected region at least corresponds to a region of a first surface of the substrate on which the plurality of unit cells are distributed; and
second, as for a device installed in a flip-chip form, a cooling structure can also be hermetically connected to a substrate, but at least all unit cells distributed in a working circuit are exposed to a cooling medium circulation cavity in the cooling structure.

By the above design and by adjusting the flow rate and flow of water, oil and other media passing through the cooling medium circulation cavity, high heat dissipation efficacy can be achieved, and the working stability and service life of the device can be further improved.

Figure 7A:
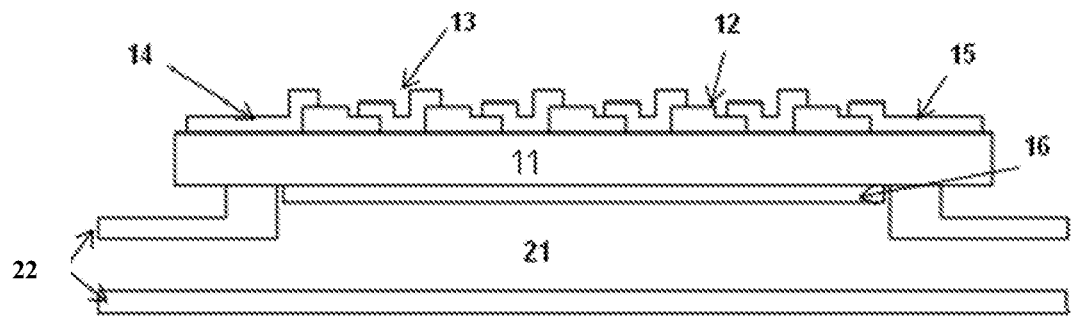
FIG. 7a to FIG. 7b are respectively a schematic heat dissipation structure diagram and a partially-enlarged schematic view of a wafer-level semiconductor device in one implementation of the present invention.
Figure 7B:
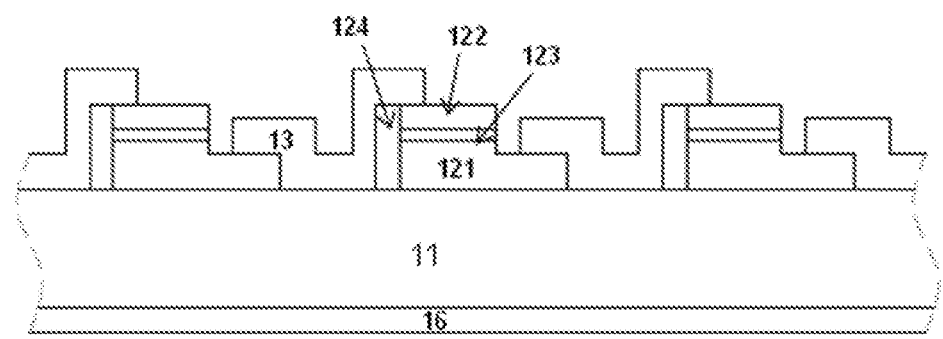

Further, still taking a heat dissipation structure suitable for a wafer-level LED chip as an example, with reference to FIG. 7a to FIG. 7b, the heat dissipation structure includes a heat dissipation housing 22 connected to the wafer-level LED chip; the wafer-level LED chip includes a wafer-level substrate 11 and plural functional unit cells 12 formed by directly processing an epitaxial layer grown on a surface of the substrate; and a cavity 21 which can store a heat conducting medium is arranged inside the heat dissipation housing, and a local region, corresponding to the functional unit cell, of one surface of the wafer-level semiconductor device is exposed to the cavity.

The each functional unit cell can include an n-type semiconductor 121, a p-type semiconductor 122, a light-emitting quantum well 123, an insulating medium 124, and other structure layers.

To make the wafer-level LED chip work normally, an interconnect metal 13 should be arranged between the functional unit cells, and electrically connected to a cathode 14, an anode 15 or the like.

Further, a reflecting layer 16 can also be connected to one surface, which is exposed to the cavity, of the wafer-level LED chip, and the functional unit cells are distributed on the other surface of the wafer-level LED chip.

Further, in one implementation of the present invention, at least a heat dissipation mechanism can be distributed on a local region of one surface, which is exposed to the cavity, of the wafer-level semiconductor device.

Figure 8A:
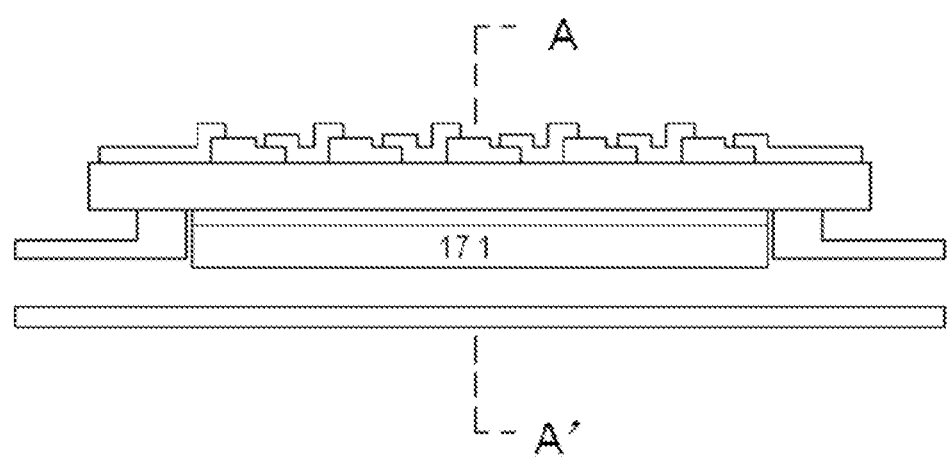
FIG. 8a to FIG. 8b are respectively a schematic heat dissipation structure diagram and a cross-sectional view in A-A direction of a wafer-level semiconductor device in one typical implementation of the present invention.
Figure 8B:
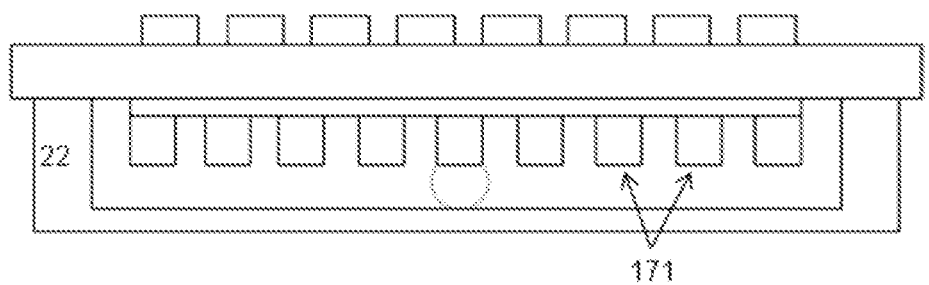

Further, with reference to FIG. 8a to FIG. 8b, the heat dissipation mechanism can include a number of fin-shaped heat dissipation plates 171 connected to one surface of the wafer-level semiconductor device, and the functional unit cells are distributed on the other surface of the wafer-level semiconductor device.

Figure 9A:
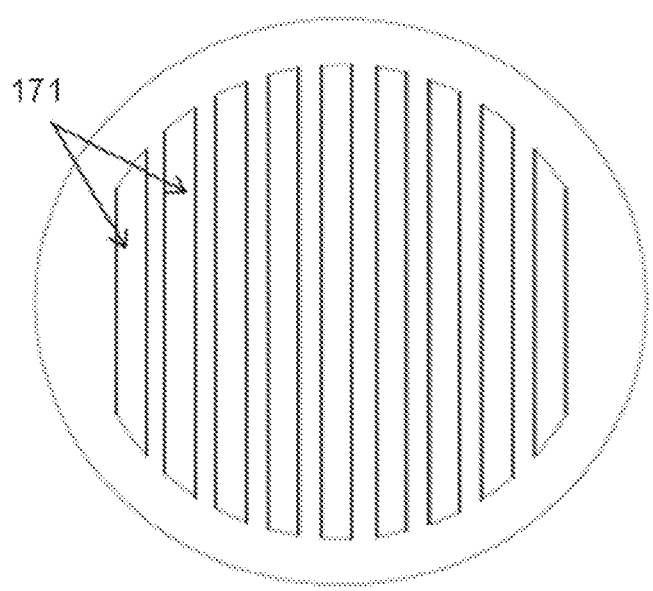
FIG. 9a to FIG. 9b are respectively a schematic structure diagram of a heat dissipation mechanism of a wafer-level semiconductor device in a number of typical embodiments of the present invention.
Figure 9B:
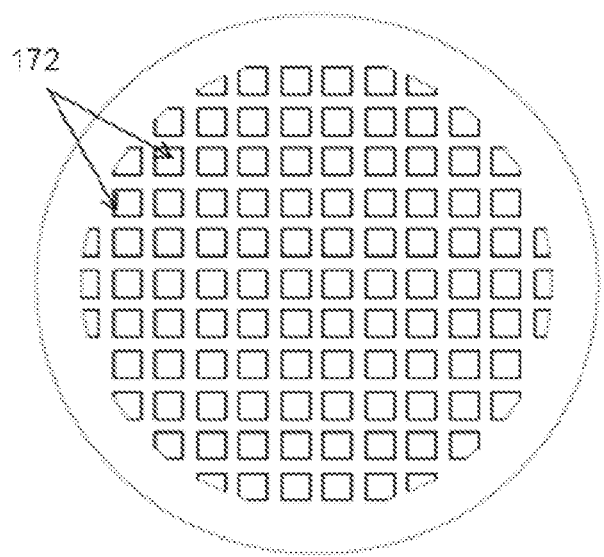

Further, with reference to FIG. 9a to FIG. 9b, the heat dissipation mechanism can include a number of heat dissipation columns 172 connected to one surface of the wafer-level semiconductor device, and the functional unit cells are distributed on the other surface of the wafer-level semiconductor device.

Figure 10:
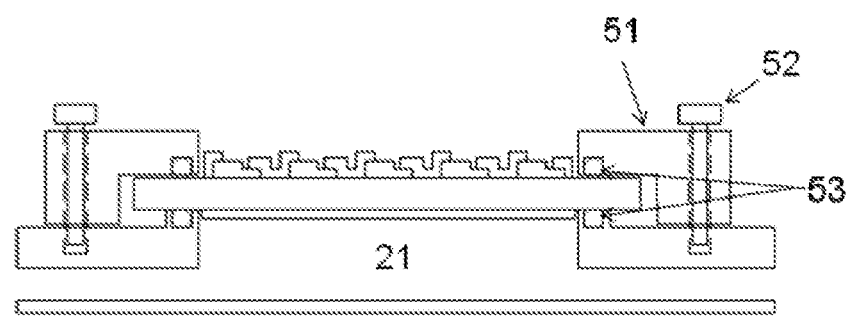
FIG. 10 is a schematic heat dissipation structure diagram of a wafer-level semiconductor device in another typical implementation of the present invention.

Further, in one typical embodiment, with reference to FIG. 10, a briquette 51 also can be arranged in the heat dissipation structure, wherein a periphery portion of the wafer-level semiconductor device is tightly held between the briquette and the heat dissipation housing, and a seal is also provided between the periphery portion of the wafer-level semiconductor device, and the briquette and the heat dissipation housing, respectively, for example, a O-shaped seal ring 53. Fasteners such as a bolt 52 can also be used to tightly fasten the briquette and the heat dissipation housing.

However, as another feasible implementation, the heat dissipation housing and the wafer-level semiconductor device can be fixed by welding. For example, with reference to FIG. 7, a solder layer 34 can be formed between the substrate and the heat dissipation housing by a solder. Thus, the substrate and the heat dissipation housing are sealed and fixedly connected, making the structure of the device simpler and more compact.

The heat-conducting medium can be material in a fluid form, for example, water, heat conducting oil or the like.

In order to improve the heat conducting efficiency, a heat-conducting medium inlet and a heat-conducting medium outlet communicated with the cavity can be arranged on the heat dissipation housing, so that the heat-conducting medium can circulate quickly.

Of course, the heat-conducting medium can also be phase change material of other types, for example, water, acetone, alcohol or the like.

Figure 11:
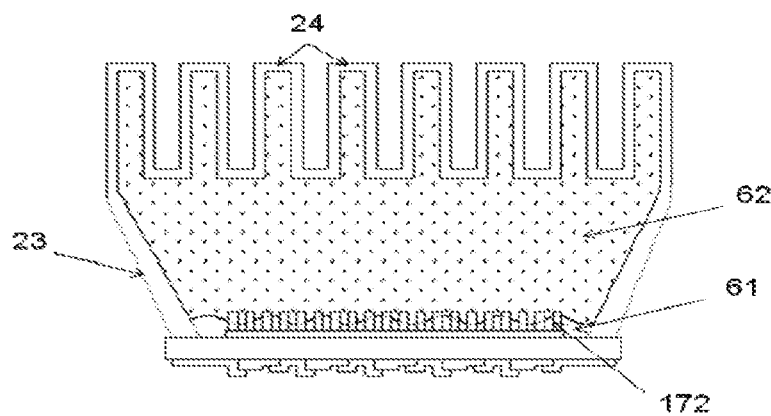
FIG. 11 is a schematic heat dissipation structure diagram of a wafer-level semiconductor device in yet another typical implementation of the present invention.
Figure 12A:
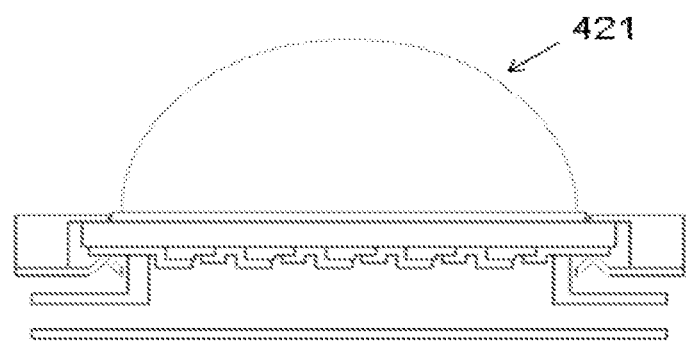
FIG. 12a to FIG. 12c are respectively a schematic view of an anti-reflection mechanism in a number of typical embodiments of the present invention.
Figure 12B:
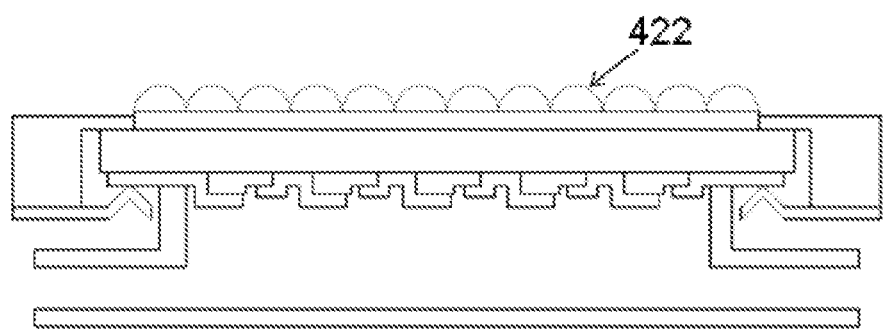
Figure 12C:
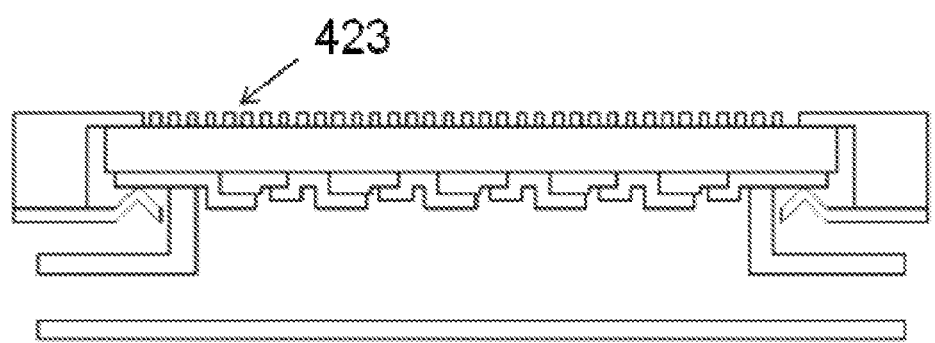

Furthermore, the heat dissipation housing can also be designed in an enclosed form. With reference to FIG. 11, in one typical embodiment, a number of heat dissipation fins 24, which are hollow, are distributed on the phase heat dissipation housing 23. When the wafer-level semiconductor device works, the phase heat dissipation liquid 61 which fills between the heat dissipation columns 172 on the back thereof, is heated to form phase change steam 62; and the phase change steam 62 enters the heat dissipation fins to exchange heat with the outside world and is then condensed again into a phase change heat dissipation liquid which flows back. Thus, the conduction of heat is achieved.

In addition, as for a wafer-level semiconductor light-emitting device, for example, an LED or the like, an anti-reflection mechanism can be arranged on a light-emitting surface of the device. The anti-reflection mechanism can be a photonic crystal structure, a big lens, a small lens assembly or the like.

As a further preferred embodiment, for an LED device or the like, a structure in which light is emitted from the back can be used, and a photonic crystal structure 421, a big lens 422, and a small lens assembly 423 can be arranged on the light-emitting surface. In this way, the light-emitting efficiency can be improved on one hand, and the active region can also be exposed to the heat-conducting medium on the other hand, thereby further shortening the heat-conducting path to improve the heat-conducting efficiency. Of course, to achieve such a design, the LED device should use a sapphire substrate or other transparent substrates. In addition, in consideration of safety and ensuring the working performance of LED devices, in this implementation, the heat-conducting medium is preferably an insulating heat-conducting medium, for example, heat-conducting oil or the like.

With the design of the heat dissipation structure, the wafer-level semiconductor layer can have the shortest heat dissipation path and the highest heat dissipation efficiency, so that the working stability of the device is improved and the service life thereof is prolonged.

In addition, in another preferred implementation, the wafer-level semiconductor device can also use a plug-in electrical connection structure including an insulating matrix and an elastic conducting structure, the elastic conducting mechanism and the insulating matrix being fixedly connected, wherein an elastic holding structure for holding the wafer-level semiconductor device is formed between a selected portion at one end or between two ends of the elastic conducting mechanism and the insulating matrix; when the wafer-level semiconductor device is inserted into the elastic holding structure, the selected portion at one end or between two ends of the elastic conducting mechanism also electrically contacts a cathode or an anode of the wafer-level semiconductor device.

Figure 13:
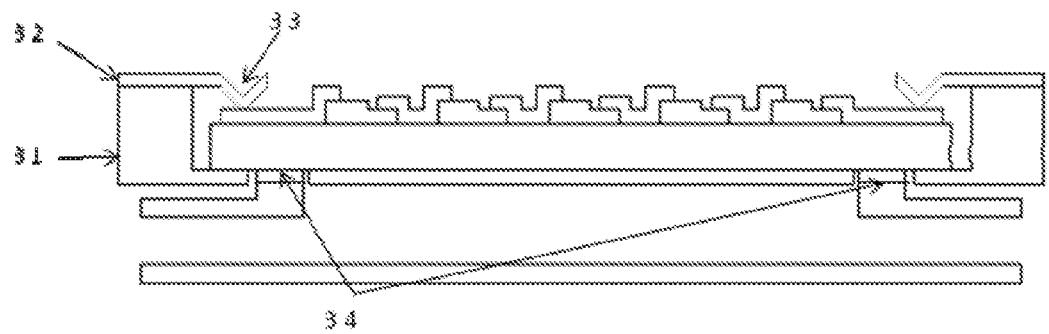
FIG. 13 is a schematic heat dissipation and electrical connection structure diagram of a wafer-level semiconductor device in one typical implementation of the present invention.

Further, with reference to FIG. 13, still taking an LED device as an example, in one preferred implementation, the elastic conducting mechanism includes a metal reed 33, one end of which is fixedly connected to the insulating matrix 31 and the other end thereof is a moving end.

In one more specific embodiment, the other end of the metal reed has at least one arc structure, and when the wafer-level semiconductor device is inserted into the elastic holding structure, a top end of the at least one arc structure electrically contacts a cathode or an anode of the wafer-level LED device Further, the elastic conducting mechanism is fixedly connected to one end of the insulating matrix and the other end thereof has a projection; and the elastic holding structure is formed between the projection and the selected portion at one end or between two ends of the elastic conducting mechanism.

When the wafer-level LED device is inserted to the elastic holding structure, the insulating matrix contacts the other surface of the substrate.

In one feasible embodiment, the elastic conducting mechanism can be electrically connected to a power supply through a lead (metal wire 32) distributed on the insulating matrix.

By replacing a traditional electrical lead-out structure with the plug-in electrical connection structure, it becomes easy to process the device with low cost; installation, replacement, and maintenance process can be performed just by inserting the wafer-level semiconductor device into or pulling it out of the elastic holding structure which is formed of an elastic conducting mechanism and an insulating base, the operation is simple and convenient without damaging the wafer-level semiconductor device; and, the operating staff can insert it or pull it out by an insulating matrix, such an operation promises the safety of the operating stuff on one hand, and avoids damage to the wafer-level semiconductor device caused by static electricity from a human body on the other hand.

Figure 14:
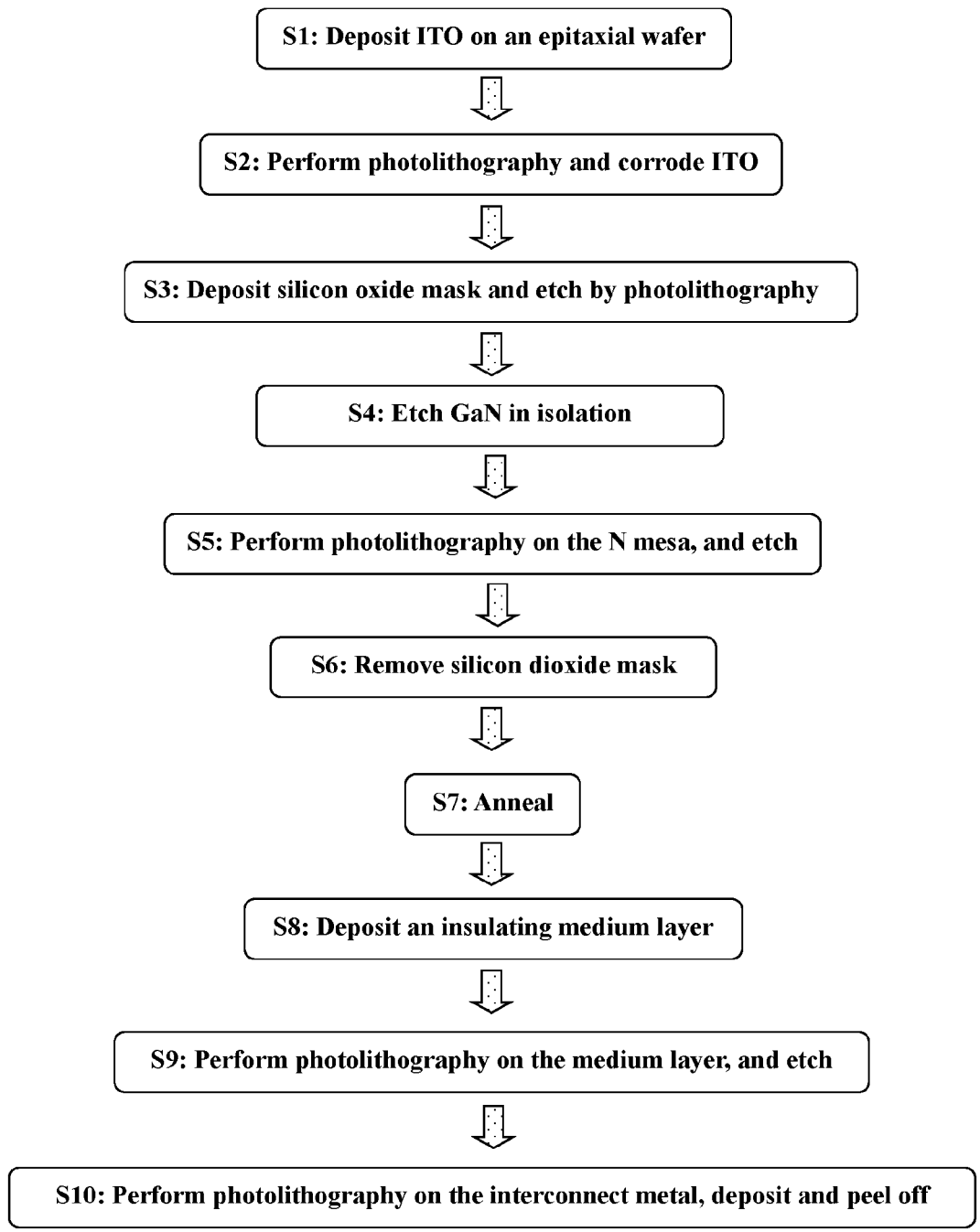
FIG. 14 is one of flowcharts of a preparation process of a wafer-level LED in one typical embodiment of the present invention.

More specifically, in one typical implementation of the present invention, with reference to FIG. 14, the method for manufacturing a wafer-level light-emitting diode can include the following steps:

step 1: depositing a transparent conducting electrode ITO (Indium Tin Oxide) on an LED epitaxial wafer;

step 2: corroding the transparent conducting electrode ITO by photolithography for the first time, to ensure that a region not covered by the photoresist is completely corroded;

step 3: depositing a thick silicon dioxide mask, and etching the side wall of the silicon dioxide mask by photolithography until a relatively slant slope occurs;

step 4: etching a gallium nitride epitaxial layer by ICP (Inductively Coupled Plasma), terminating at the insulating substrate;

step 5: performing photolithography on the N mesa, and then etching the gallium nitride epitaxial layer to a N-type heavily doped region by ICP;

step 6: completely removing the mask by a wet process;

step 7: annealing;

step 8: depositing an insulating medium layer;

step 9: performing photolithography for the fourth time and etching the insulating medium layer which is not covered by the photoresist to ensure that it is completely removed; and step 10: performing photolithography for the last time, and depositing metal and then peeling it off.

Since a large quantity of LED unit cells are integrated in a wafer-level LED (light-emitting diode), by the manufacturing method, the yield of wafer-level LEDs can be effectively improved, and meanwhile the electrical performance and reliable performance of the devices can also be improved. The manufacturing process is easy to control and can be completely compatible with the existing processes.

Among those steps, step 3, step 4, and step 5 are performed successively, or can be performed in an order of step 5, step 3 and step 4.

In step 5 of etching the silicon dioxide mask, it is dry etched first and then wet etched.

Step 7 (annealing) is performed after steps 1 to 6.

Step 7 (annealing) can also be performed after step 2, and other following steps are postponed.

The insulating medium layer can be a sandwich structure of silicon dioxide/silicon nitride/silicon dioxide.

With regard to the present invention, by depositing and corroding ITO in advance, short circuit and electricity leakage between LED unit cells can be obviously reduced. The thick silicon dioxide etched by a dry process and a wet process results in a large slope on the side wall of the silicon dioxide, and the slope is transferred to the gallium nitride layer by ICP etching so that the interconnect metal is less likely to experience broken-circuit at the slope.

Figure 15:
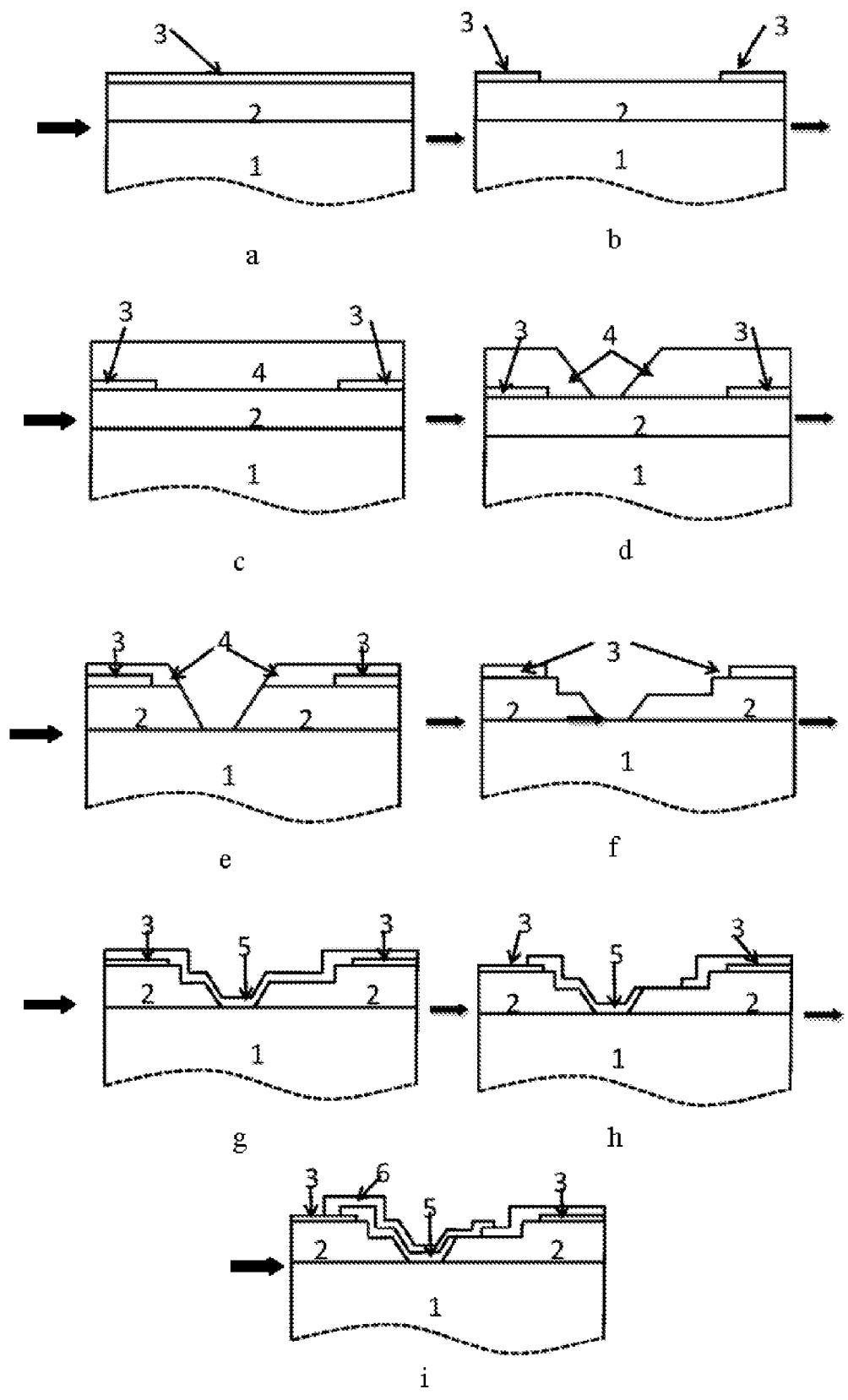
FIG. 15 is a second one of flowcharts of the preparation process of a wafer-level LED in one typical embodiment of the present invention.

For another example, in another more specific embodiment, a method for manufacturing a wafer-level LED (light-emitting diode) can include:

step S1: dipping a cleaned LED epitaxial wafer in chloroazotic acid to remove the natural oxidation layer and metal particles on the surface; then ultrasonically cleaning with deionized water, and blowing it dry by high-pressure nitrogen; and depositing ITO by an optical coating machine (with reference to FIG. 15, *a*);

step S2: performing photolithography and corroding ITO (with reference to FIG. 15, *b*), removing the photoresist and cleaning after making sure that ITO in a region not covered by the photoresist is completely corroded;

step S3: depositing silicon dioxide with a certain thickness (for example, a thickness of about 2.5 μm to 3.5 μm) by PECVD (Plasma Enhanced Vapor Chemical Deposition), and performing photolithography in isolation and etching the silicon dioxide, where the silicon dioxide is first dry etched and then wet etched until a slope of 30° to 60° occurs and the photoresist is then removed (with reference to FIG. 15, *c*);

step S4: selecting appropriate ICP etching conditions to etch GaN in isolation so that the slope of silicon dioxide can be transferred to the gallium nitride epitaxial layer (with reference to FIG. 15, *d*), and making sure that GaN in the isolated region is completely etched;

step S5: performing photolithography on the N mesa: completely removing silicon dioxide in the window by RIE (Reactive Ion Etching), removing the photoresist, and etching GaN by ICP (with reference to FIG. 15, *e*);

step S6: completely corroding the remaining silicon dioxide by BOE (Buffer Oxide Etcher);

step S7: annealing with the presence of compressed air of 450 ∟ to 650 ∟ (with reference to FIG. 15, *f*);

step S8: depositing silicon dioxide/silicon nitride/silicon dioxide as an insulating layer by PECVD (with reference to FIG. 15, *g*);

step S9: performing photolithography on the medium, etching the insulating medium layer in a region not covered by the photoresist and ensuring that it is completely removed, and then, completely removing the photoresist (with reference to FIG. 15, *h*); and step S10: performing photolithography on the interconnect metal, depositing Ti/Al/Ni/Al/Ni/Au as the interconnect metal by electron beam evaporation, and finally, ultrasonically peeling off metal in the non-interconnect region (with reference to FIG. 15, *i*).

At last, it should be noted that the above-mentioned implementations are merely provided for describing the technical solutions of the present invention, and not intended to limit the present invention. It should be understood by those skilled in the art that modifications still can be made to the technical solutions recorded in the above implementations, or some technical features thereof can be equivalently replaced. Those modifications or replacements will not rend the essence of the corresponding technical solutions depart from the spirit and scope of the solutions of the present invention.

The invention claimed is:

1. A wafer-level semiconductor device, comprising:
a wafer-level substrate,
a plurality of serial groups which are formed on a surface of the substrate and are disposed in parallel, each serial group comprising a plurality of parallel groups disposed in series, each parallel group comprising a plurality of unit cells disposed in parallel, each unit cell being an independent functional unit which is formed by processing a semiconductor layer directly grown on the surface of the substrate; and
a lead, which is at least electrically connected between one selected parallel group in each serial group and one electrode of the semiconductor device and/or between two selected parallel groups to make ON-voltages of all the serial groups substantially consistent
wherein all the unit cells formed on the surface of the substrate comprise a plurality of normal unit cells and a plurality of redundant unit cells, the plurality of normal unit cells are arranged as a plurality of multi-stage unit groups disposed in parallel, any one of the multi-stage unit groups comprises a plurality of parallel groups disposed in series, and M first parallel groups selected from any one of the multi-stage unit groups form a serial group with N second parallel groups,
wherein any one of the first parallel groups comprises the plurality of normal unit cells disposed in parallel, and any one of the second parallel groups comprises the plurality of redundant unit cells disposed in parallel, M being a positive integer, N being 0 or a positive integer.

2. The wafer-level semiconductor device according to claim 1, characterized in that at least one serial group also has at least one matched resistor.

3. The wafer-level semiconductor device according to claim 1, characterized in that more than two first parallel groups selected from at least one multilayer unit group are connected in series with at least one second parallel group directly through a lead to form a serial group.

4. The wafer-level semiconductor device according to claim 1, characterized in that the wafer-level semiconductor device further comprises a heat dissipation structure, the heat dissipation structure comprising at least one heat dissipation housing connected to the wafer-level semiconductor device; a cavity which can store a heat-conducting medium is provided inside the heat dissipation housing; and at least a local region, at least corresponding to the functional unit cell, of one surface of the wafer-level semiconductor device is exposed to the cavity.

5. The wafer-level semiconductor device according to claim 4, characterized in that a heat dissipation mechanism is at least distributed in at least a local region, which is exposed to the cavity, of one surface of the wafer-level semiconductor device.

6. The wafer-level semiconductor device according to claim 5, characterized in that: the heat dissipation mechanism comprises plural platy and/or columnar heat dissipation components at least connected to one surface of the wafer-level semiconductor device.

7. The wafer-level semiconductor device according to claim 4, characterized in that: the heat dissipation structure comprises plural fin-shaped heat dissipation plates arranged on one surface of the wafer-level semiconductor device in parallel or multiple heat dissipation columns distributed on one surface of the wafer-level semiconductor device in arrays.

8. The wafer-level semiconductor device according to claim 4, characterized in that a reflecting layer is connected on one surface of the wafer-level semiconductor device exposed to the cavity, and the functional unit cell is distributed on the other surface of the wafer-level semiconductor device.

9. The wafer-level semiconductor device according to claim 4, characterized in that a reflecting layer is also disposed between the heat dissipation mechanism and one surface of the wafer-level semiconductor device.

10. The wafer-level semiconductor device according to claim 4, characterized in that a heat-conducting medium inlet and a heat-conducting medium outlet communicated with the cavity are also distributed on the heat dissipation housing.

11. The wafer-level semiconductor device according to claim 4, characterized in that the heat dissipation housing has an enclosed inner cavity and the heat dissipation housing also has plural heat dissipation fins.

12. The wafer-level semiconductor device according to claim 4, characterized in that the heat dissipation mechanism also comprises a briquette, wherein at least a periphery portion of the wafer-level semiconductor device is tightly held between the briquette and the heat dissipation housing, and a seal is also provided between the periphery portion of the wafer-level semiconductor device, and the briquette and the heat dissipation housing, respectively.

13. The wafer-level semiconductor according to claim 12, characterized in that the heat dissipation mechanism also comprises a fastener used for tightly fastening the briquette and the heat dissipation housing.

14. The wafer-level semiconductor device according to claim 4, characterized in that the heat dissipation housing and the wafer-level semiconductor device are fixed by welding.

15. The wafer-level semiconductor device according to claim 1, characterized in that the wafer-level semiconductor device also comprises a plug-in electrical connection structure, the plug-in electrical connection structure comprising an insulating matrix and an elastic conducting mechanism, the elastic conducting mechanism being fixedly connected to the insulating matrix, wherein an elastic holding structure for holding the wafer-level semiconductor device is formed between a selected portion at one end or between two ends of the elastic conducting mechanism and the insulating matrix; when the wafer-level semiconductor device is inserted into the elastic holding structure, the selected portion at one end or between two ends of the elastic conducting mechanism also electrically contacts a cathode or an anode of the wafer-level semiconductor device.

16. The wafer-level semiconductor device according to claim 15, characterized in that the elastic conducting mechanism comprises a metal reed, one end of which is fixedly connected to the insulating matrix and the other end thereof is a moving end.

17. The wafer-level semiconductor device according to claim 16, characterized in that the other end of the metal reed has at least one arc structure, and when the wafer-level semiconductor device is inserted into the elastic holding structure, a top end of the at least one arc structure electrically contacts a cathode or an anode of the wafer-level semiconductor device.

18. The wafer-level semiconductor device according to claim 15, characterized in that: the elastic conducting mechanism is fixedly connected to one end of the insulating matrix, and the other end thereof has a projection; and the elastic holding structure is formed between the projection and the selected portion at one end or between two ends of the elastic conducting mechanism.

19. The wafer-level semiconductor device according to claim 15, characterized in that the elastic conducting mechanism is electrically connected to a power supply through a lead distributed on the insulating matrix.

20. The wafer-level semiconductor device according to claim 15, characterized in that, when the wafer-level semiconductor device is inserted into the elastic holding structure, the insulating matrix contacts the other surface of the substrate.

21. The wafer-level semiconductor according to claim 1, characterized in that a diameter of the wafer-level substrate is over 2 inches.

22. The wafer-level semiconductor device according to claim 1, characterized in that an ON-voltage of the serial group is 110 V±20 V, 220 V±40 V, or 380 V±70 V.

23. The wafer-level semiconductor according to claim 1, characterized in that the wafer-level semiconductor device comprises a semiconductor laser, an LED or a diode.

24. The wafer-level semiconductor device according to claim 23, characterized in that the wafer-level semiconductor device is a semiconductor light-emitting device; and an anti-reflection mechanism is distributed on a light-emitting surface of the semiconductor light-emitting device, the anti-reflection mechanism comprising a photonic crystal structure or more than one lens mechanism.

25. A method for manufacturing the wafer-level semiconductor device according to claim 1, comprising:
   forming the plurality of serial groups disposed in parallel on the surface of the wafer-level substrate, wherein each serial group comprises the plurality of parallel groups disposed in series, and each parallel group comprises the plurality of unit cells disposed in parallel, and each unit cell is the independent functional unit which is formed by processing the semiconductor layer directly grown on the surface of the substrate; and
   electrically connecting the selected parallel group in each serial group to one electrode of the semiconductor device and/or electrically connecting two selected parallel groups in each serial group through the lead to make ON-voltages of all the serial groups substantially consistent.

26. The method for manufacturing a wafer-level semiconductor according to claim 25, comprising the following steps:
   (1) providing a wafer-level substrate having a semiconductor layer gown on a first surface, i.e. a wafer-level LED epitaxial wafer;
   (2) forming a plurality of unit cells by processing the semiconductor layer;
   (3) selecting part of the plurality of unit cells as normal unit cells and the remaining as redundant unit cells, dividing all the normal unit cells into more than two multi-stage unit groups which are disposed in parallel, any one of the multi-stage unit groups comprising more than two first parallel groups; and
   selecting and connecting M first parallel groups in any one of the multi-stage unit groups with N second parallel groups in series to form a serial group, to make ON-voltages of the more than two serial groups substantially consistent,
   wherein any one of the first parallel groups comprises a plurality of normal unit cells disposed in parallel, and any one of the second parallel groups comprises a plurality of redundant normal unit cells disposed in parallel, M being a positive integer, N being 0 or a positive integer.

27. The method for manufacturing a wafer-level semiconductor device according to claim 26, comprising:
   connecting in series more than two first parallel groups selected from any one of the multi-stage unit groups with at least one second parallel group directly through a lead; or
   providing at least one matched resistor in at least one serial group.

28. The method for manufacturing a wafer-level semiconductor device according to claim 26, further comprising:
   connecting the substrate and a heat dissipation structure and/or a plug-in electrical connection structure.

29. The method for manufacturing a wafer-level semiconductor device according to claim 25, further comprising:
   (1) providing an epitaxial wafer, the epitaxial wafer comprising the substrate and a semiconductor material layer grown on the substrate;
   (2). forming a transparent conducting layer on the semiconductor material layer;
   (3). etching on the transparent conducting layer, and forming a transparent electrode pattern;
   (4)
      I. forming a mask layer on the epitaxial wafer, and etching a selected region of the mask layer until the semiconductor material layer is exposed, and forming a slope of 30° to 60° on a side wall of the mask layer in the etched region,
      etching a part of the semiconductor material layer exposed from the mask layer until the substrate is exposed, to form functional unit cell matrixes separated from each other in the semiconductor material layer, and
      continuously etching the part of the semiconductor material layer exposed from the mask layer, to form a mesa structure inside each functional unit cell matrix; or
      II. continuously etching a part of the semiconductor material layer exposed from the mask layer, to form a mesa structure inside each functional unit cell matrix, and
      forming a mask layer on the epitaxial wafer, and etching a selected region of the mask layer until the semiconductor material layer is exposed, and forming a slope of 30° to 60° on a side wall of the mask layer in the etched region, and
      etching the part of the semiconductor material layer exposed from the mask layer until the substrate is exposed, to form functional unit cell matrixes separated from each other in the semiconductor material layer;
   (5) completely removing the mask layer, and forming an insulating medium layer on the epitaxial wafer;
   (6) etching a selected region of the insulating medium layer, to expose an interconnect metal region, which is used for depositing interconnect metal, on each functional unit cell matrix; and;
   (7) depositing interconnect metal on the epitaxial wafer, and peeling off the interconnect metal not deposited in the interconnect metal region to electrically connect functional unit cells that are coordinated.

* * * * *